United States Patent
Fendler et al.

(10) Patent No.: US 7,645,686 B2
(45) Date of Patent: Jan. 12, 2010

(54) METHOD OF BONDING CHIPS ON A STRAINED SUBSTRATE AND METHOD OF PLACING UNDER STRAIN A SEMICONDUCTOR READING CIRCUIT

(75) Inventors: Manuel Fendler, Grenoble (FR); Abdenacer Ait-Mani, Saint Egreve (FR); Alain Gueugnot, Sassenage (FR); Francois Marion, Saint-Martin le Vinoux (FR)

(73) Assignee: Commissariat a l'Energie Atomique, Paris (FR)

( * ) Notice: Subject to any disclaimer, the term of this patent is extended or adjusted under 35 U.S.C. 154(b) by 0 days.

(21) Appl. No.: 12/212,302

(22) Filed: Sep. 17, 2008

(65) Prior Publication Data
US 2009/0075423 A1 Mar. 19, 2009

(30) Foreign Application Priority Data
Sep. 19, 2007 (FR) .................... 07 57676

(51) Int. Cl.
 *H01L 21/00* (2006.01)
(52) U.S. Cl. .................. 438/464; 438/460; 438/118; 257/E21.596; 257/E21.122
(58) Field of Classification Search .................. 438/118, 438/460, 464; 257/E21.122, E21.596
See application file for complete search history.

(56) References Cited
U.S. PATENT DOCUMENTS
4,943,491 A 7/1990 Norton
6,255,140 B1 7/2001 Wang
6,465,330 B1 * 10/2002 Takahashi et al. ............ 438/464
7,169,652 B2 * 1/2007 Kimura ....................... 438/149
2002/0038905 A1 4/2002 Sugizaki
2002/0048906 A1 4/2002 Sakai
2008/0318346 A1 * 12/2008 Maki et al. ..................... 438/7

FOREIGN PATENT DOCUMENTS
FR 2646018 10/1990
FR 2810454 12/2001
FR 2857508 1/2005

OTHER PUBLICATIONS
French Preliminary Search Report for FR07-57676, dated Apr. 18, 2008.

* cited by examiner

*Primary Examiner*—Alexander G Ghyka
*Assistant Examiner*—Seahvosh J Nikmanesh
(74) *Attorney, Agent, or Firm*—Pearne & Gordon LLP

(57) ABSTRACT

The invention concerns a method of collective bonding of individual chips on a strained substrate (44), which comprises the following steps: functionalised layers (40) are arranged on a support (41), in an adjacent non-contiguous manner, with a space e between two neighboring layers (40), a calibrated drop of adhesive (43) is deposited on each of these functionalised layers, the strained substrate (44) is transferred onto these drops of adhesive, the parts of the assembly thereby formed are singularized to produce chips (45) bonded to the surface of strained substrate. The invention also concerns a method of placing under strain a semiconductor reading circuit by a substrate in a material of different coefficient of expansion.

6 Claims, 2 Drawing Sheets

METHOD OF BONDING CHIPS ON A STRAINED SUBSTRATE AND METHOD OF PLACING UNDER STRAIN A SEMICONDUCTOR READING CIRCUIT

TECHNICAL FIELD

The invention concerns a method of bonding chips on a strained substrate and a method of placing under strain a semiconductor reading circuit by a material of different coefficient of expansion.

STATE OF THE PRIOR ART

Making heterogeneous assemblies, in other words constituted of two parts with different properties, for example different coefficients of expansion or Young's moduli, thermo-mechanically reliable necessitates the exploitation of a bimetallic element structure, or even a structure known as BCS (Balanced Composite Structure). Such structures are characterised by the bonding of a substrate known as a strained substrate on the assembly to be made reliable.

The document referenced [1] at the end of the description thus describes an assembly of interconnections between a reading circuit and detection focal plane. This assembly, as illustrated in FIG. 1, comprises a first layer 10 in semi-conductor for detecting a radiation 11 having a first coefficient of expansion, a second semi-conductor electronic circuit multiplexing layer 12 having a second coefficient of expansion, a third interconnecting layer 13 situated between the two first layers 10 and 12, and a strained substrate 14 having a high coefficient of expansion bonded to the lower surface of the second layer 12. This document describes a structure made reliable "bottom up".

The document referenced [2] describes a structure made reliable "top down". As illustrated in FIG. 2, this structure comprises a layer 20 for detecting a radiation 21, a reading layer 22 and an interconnecting layer 23 situated between these two first layers 20 and 22. The reading layer 22, formed in a first semiconductor material, serves as mechanical reference. A strained substrate 24, in a second material transparent to the radiation and adapted to the first material, is arranged above the detection means 20.

In these two documents, the structures are characterised by the bonding of a strained substrate on the assembly to be made reliable.

The document referenced [3] describes a hybrid focal plane network structure. As illustrated in FIG. 3, this structure comprises a layer 30 in semi-conductor for detecting an incident radiation 31, a multiplexing layer 32, and an interconnecting layer 33 between these two layers 30 and 32. A strained substrate 34 having mechanical and geometric characteristics identical to those of the detection layer 30 is bonded to the lower surface of the layer 32. A supplementary layer 35 having identical characteristics to those of the layer 32 serves to correct the curvature of the assembly generated by the bimetallic element 32, 34. The assembly of these three layers 32, 34, 35, forming a BCS structure, enables the assembly to be made reliable. This structure is thereby made reliable "bottom up".

However the bonding of a strained substrate on an assembly to be made reliable has to be carried out with a homogeneous film of adhesive, without bubbles, which enables good mechanical coupling between the assembled parts in order to fully benefit from the bimetallic element effect.

Numerous documents of the prior art relative to bonding techniques concern the treatment of surfaces and their physical and chemical properties enabling good wetting and strong adhesion to be obtained. The bonding methods are of the field of the known art. In general, the absence of bubbles and the homogeneity of bonding are obtained by degassing, bonding under vacuum, centrifugation, plugging or through application of high pressures. Such techniques are difficult to use for large surface areas, when the tolerance linked to the least asperity or to the least bonding defect becomes virtually zero, which is the case of microelectronics.

Moreover, such techniques, for example vacuum deposition and molecular adhesion techniques, which require an extreme level of cleanliness (clean rooms classed less than 100), are costly.

In order to offset such drawbacks, the subject of the invention is a low cost method that makes it possible to carry out a collective bonding of individual chips on a common substrate, which is like a large surface area bonding, by exploiting all of the advantages of a small surface area unitary bonding.

DESCRIPTION OF THE INVENTION

The invention concerns a method of collective bonding of individual chips on a strained substrate, comprising the following steps:

functionalised layers are arranged on a support, for example adhesive, wherein these functionalised layers are arranged in an adjacent non-contiguous manner with a space e between two neighbouring layers, a calibrated drop of adhesive is deposited on each of these functionalised layers, the strained substrate is transferred onto the drops of adhesive, the parts of the assembly thereby formed are singularised to produce chips bonded on the strained substrate, characterised in that the adhesive deposited on each functionalised layer is a calibrated drop of adhesive, and in that the substrate has hollows above the spaces e.

Advantageously, the space e is between 40 μm and 500 μm. The functionalised layers are formed in silicon.

The invention also concerns a method of placing under strain a semiconductor reading circuit, for example in silicon, by a substrate in a material of different coefficient of expansion implementing the above method. Advantageously, this material is chosen among the following materials: germanium, sapphire, BeO.

DETAILED DESCRIPTION OF SPECIFIC EMBODIMENTS

The method of the invention is a method of collective bonding of individual chips on a common substrate.

Figure 1:
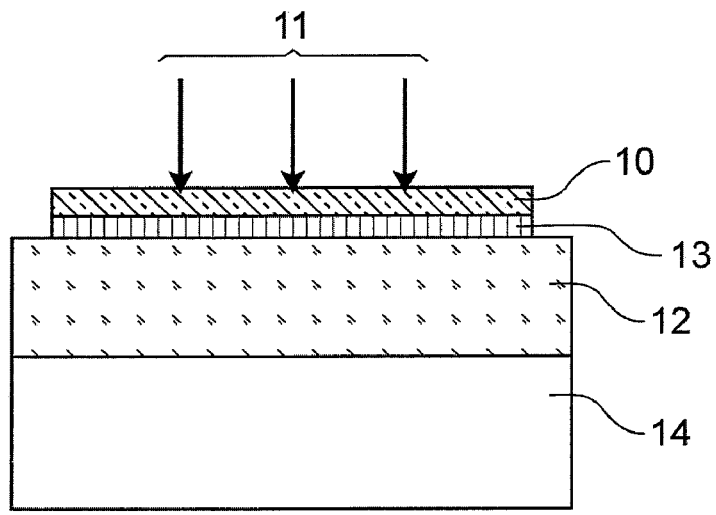
FIGS. 1 to 3 illustrate embodiments of the prior art.
Figure 2:
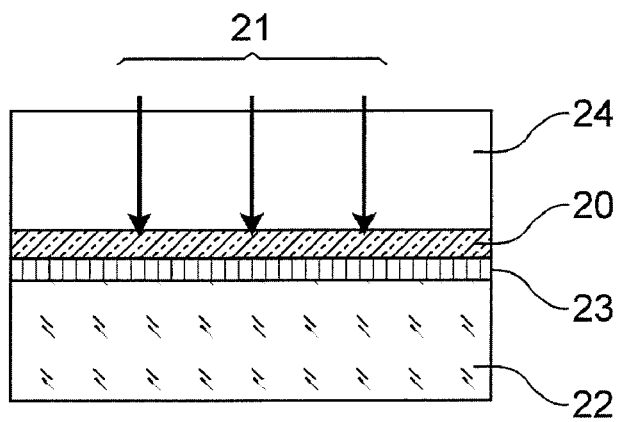
Figure 3:
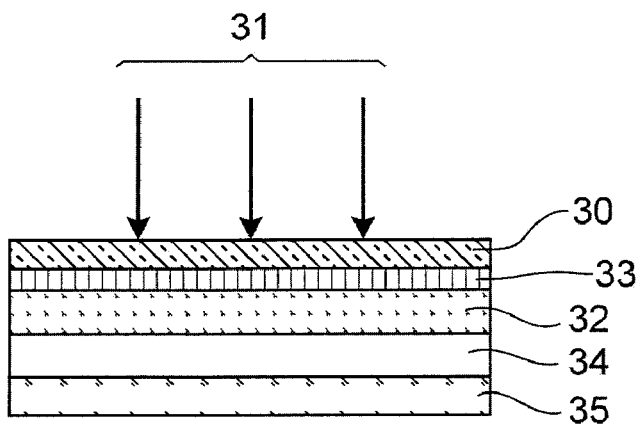
Figure 4:
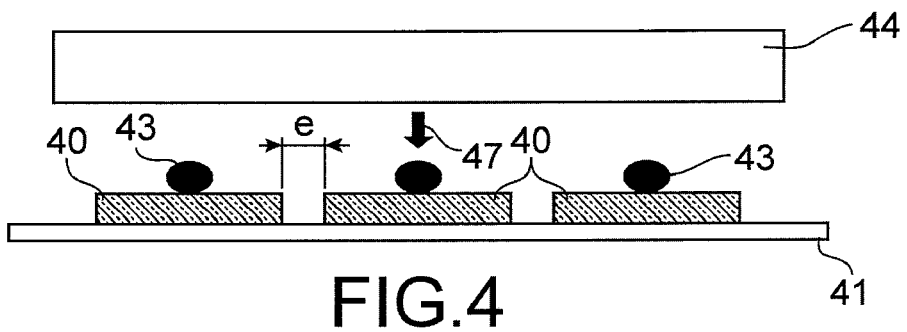
FIGS. 4 to 7 illustrate the method of the invention.

According to the method of the invention, illustrated in FIG. 4, layers 40 known as "functionalised" or active, in other words integrating for example reading circuits, are arranged on a support 41, for example adhesive. In the case where these functionalised layers 40 have a surface structuring due for example to interconnection pads (for example brazing bumps) to subsequently interconnect the layers 40 to another circuit, the pads are directly in contact with the adhesive support 41. These functionalised layers 40 are arranged in an adjacent non-contiguous manner, with a space e between them between 40 µm and 500 µm.

A calibrated drop of adhesive 43 is then deposited on each of these functionalised layers.

Figure 5:
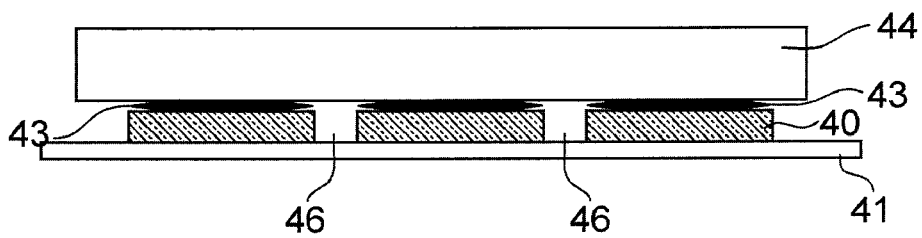

A strained substrate 44 is, then, transferred (arrow 47) onto the assembly thereby formed, which enables the embodiment illustrated in FIG. 5 to be obtained.

Figure 6:
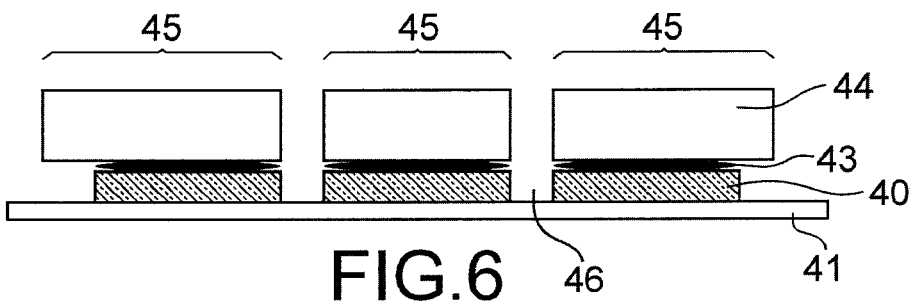

Chips 45 are then singularised by cutting up the strained substrate 44 as illustrated in FIG. 6. These chips 45 are then disbonded from the support 41.

The method of the invention allies the advantages of a "large surface area" bonding, through the simultaneous treatment of several chips 45 via the bonding of a large size strained substrate 44 onto functionalised layers 40 pre-arranged on the support 41, with the advantages of unitary bonding known as "low surface area" bonding enabling the appearance of bubbles to be avoided.

By arranging the functionalised layers in an adjacent non-contiguous manner, channels 46 like reservoirs enabling the bubbles to be trapped locally are created between them. The bubbles expelled towards the exterior of a functionalised layer 40 therefore do not need to cover all of the strained substrate 44 to be evacuated to the exterior.

Figure 7:
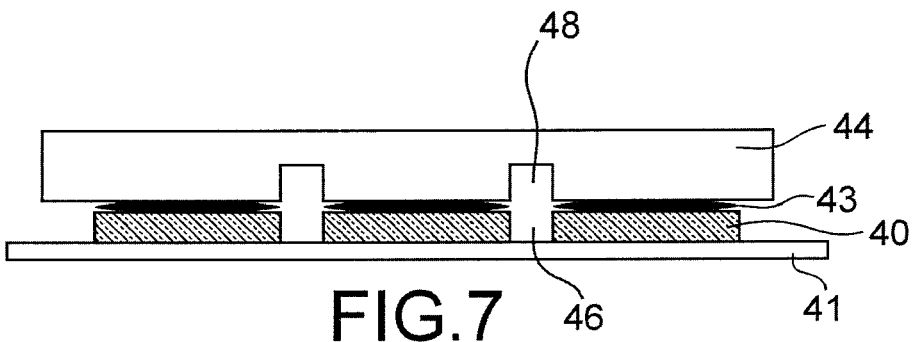

It is also possible to increase these channels 46 by forming in the strained substrate hollows 48 situated above the channels 46. This then gives the embodiment of FIG. 7, in place of the embodiment of FIG. 5. This enables, among others, to reduce the spaces e while preserving the same volume available for the adhesive to be eliminated.

The method of the invention may be used for example to place under strain a silicon reading circuit (44) by a substrate in a material of different coefficient of expansion adapted to the components to be hybridised. This may be, for example:
   germanium on silicon in the case of CdHgTe or CdTe detectors,
   sapphire on silicon in the case of CdHgTe or CdTe detectors,
   BeO on silicon in the case of CdHgTe or CdTe detectors.

Such materials are most commonly used in the field of cooled infrared radiation (CdHgTe) or X-rays (CdTe). To these materials may be added all materials of the type metals, semiconductors, ceramics, glasses and polymers, the thermo-mechanical properties of which are suited to the targeted application. In the case of CdHgTe, by way of non-exhaustive examples, the following materials may be cited: Mo, CuMoCu, FeNiCo, frits on metal, solid Cd(Zn)Te, etc.

Generally speaking, the method of the invention is applicable to any embodiment of a bimetallic element (or an assembly of more than two layers, as described in the document referenced [3]), intended to modify the thermo-mechanical behaviour of a substrate, in order to adapt the coefficients of expansion.

The method of the invention thus makes it possible to strain any material to embrace the thermo-mechanical behaviour of another material by respecting the behavioural rules of bimetallic elements.

The method of the invention may, more widely, be applied to any multiple bonding of chips or materials on a base: for example, the transfer of optical chips (InP, GaAs, silica) on silicon assembly platforms (silicon optical benches), as described in the document referenced [4]. It is also possible to cite the transfer of chips on bases (GaN chips for lighting, silicon chips on ceramics on bases of packages, MCM or "Multi Chip Modules") or encapsulation (packaging), in the general sense of the term, as described in the document referenced [5].

Advantageously, the signature of the collective method, and thus common to the chips of a same batch, according to the invention is easy to demonstrate as regards the bonding characteristics, which are:
   the nature and identical thickness of adhesive,
   the identical level of cross-linking,
   the identical Shore hardness.

REFERENCES

[1] U.S. Pat. No. 4,943,491
[2] U.S. Pat. No. 5,365,088
[3] EP 0 829 907
[4] "Die attachment methods" by Leo G. Feinstein (Electronic Materials Handbook, vol. 1 Packaging, ASM International, pp. 213-223, 1989)
[5] "Overview of Multichip Technology" by John W. Balder (Electronic Materials Handbook, vol. 1 Packaging, ASM International, pp. 297-312, 1989).

The invention claimed is:

1. Method of collective bonding of individual chips on a strained substrate, comprising the following steps:
   functionalised layers are arranged on a support, in an adjacent non-contiguous manner, with a space e between two neighbouring layers,
   the adhesive is deposited on each of these functionalised layers,
   the strained substrate is transferred onto this adhesive,
   parts of the assembly thereby formed are singularised to produce chips bonded on the strained substrate,
   wherein the adhesive deposited on each functionalised layer is a calibrated drop of adhesive, and the substrate has hollows above the spaces.

2. Method according to claim 1, in which the functionalised layers are arranged on an adhesive support.

3. Method according to claim 1, in which the space e is between 40 µm and 500 µm.

4. Method according to claim 1, in which the functionalised layers are formed in silicon.

5. Method of placing under strain a semiconductor reading circuit by a substrate in a material of different coefficient of expansion implementing the method according to claim 1.

6. Method according to claim 5, in which the material is chosen among the following materials: germanium, sapphire, BeO.

* * * * *